(12) United States Patent
Shin et al.

(10) Patent No.: US 6,730,570 B2
(45) Date of Patent: May 4, 2004

(54) METHOD FOR FORMING A SELF-ALIGNED CONTACT OF A SEMICONDUCTOR DEVICE AND METHOD FOR MANUFACTURING A SEMICONDUCTOR DEVICE USING THE SAME

(75) Inventors: Seung-Mok Shin, Suwon-Si (KR); Jae-Jong Han, Seoul (KR); Ki-Hyun Hwang, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 61 days.

(21) Appl. No.: 10/348,017

(22) Filed: Jan. 22, 2003

(65) Prior Publication Data

US 2004/0056281 A1 Mar. 25, 2004

(30) Foreign Application Priority Data

Sep. 24, 2002 (KR) ................... 10-2002-0057764

(51) Int. Cl.[7] .................. H01L 21/336; H01L 29/76
(52) U.S. Cl. .............. 438/299; 438/303; 438/639; 257/387; 257/346
(58) Field of Search .................. 438/299, 300, 438/301, 303, 304, 637, 639, 643, 676; 257/382, 387, 388, 346, 332, 333

(56) References Cited

U.S. PATENT DOCUMENTS

| 6,027,966 | A | * | 2/2000 | Saenger et al. | 438/239 |
| 6,265,313 | B1 | * | 7/2001 | Huang et al. | 438/687 |
| 6,319,824 | B1 | * | 11/2001 | Lee et al. | 438/639 |
| 6,489,234 | B1 | * | 12/2002 | Itoh | 438/639 |

FOREIGN PATENT DOCUMENTS

JP  2000-340655  9/2000

\* cited by examiner

Primary Examiner—Kevin M. Picardat
(74) Attorney, Agent, or Firm—Harness, Dickey

(57) ABSTRACT

A method for forming a self-aligned contact in a semiconductor device which can reduce process failures and a method for manufacturing a semiconductor device that includes the self-aligned contact are provided. A self-aligned contact hole is formed in an interlayer dielectric film to expose a portion of the substrate between conductive structures formed thereon. A buffer layer is formed on a sidewall of the self-aligned contact hole, on the bottom of the self-aligned contact hole, and on the interlayer dielectric film such that the thickness of the buffer layer at an upper portion of the self-aligned contact hole is greater than the thickness of the buffer layer at the bottom of the self-aligned contact hole. After removing the portion of the buffer layer on the bottom of the self-aligned contact hole, a contact is formed in the self-aligned contact hole to make contact with the substrate.

34 Claims, 14 Drawing Sheets

METHOD FOR FORMING A SELF-ALIGNED CONTACT OF A SEMICONDUCTOR DEVICE AND METHOD FOR MANUFACTURING A SEMICONDUCTOR DEVICE USING THE SAME

CROSS-REFERENCE TO RELATED APPLICATIONS

This non-provisional application claims priority under 35 U.S.C. § 119 to Korean Patent Application No. 2002-57764 filed Sep. 24, 2002, the contents of which are incorporated herein by reference in its entirety.

BACKGROUND OF THE INVENTION

1. Field of the Invention

The present invention relates generally to a method for forming a self-aligned contact hole of a semiconductor device and a method for manufacturing a semiconductor device, and more particularly, to a method for forming a self-aligned contact in a semiconductor device which can reduce process failures caused in accordance with the reduction of the design rule and a method for manufacturing a semiconductor device that includes a self-aligned contact.

2. Description of the Related Art

Semiconductor devices have been rapidly developed due to the wide use of information processing devices such as computers, and are typically required to have a large storage capacity and a high operation speed. To meet these requirements, semiconductor technology has been developed so that semiconductor devices have a high integration density, good reliability, and a high response speed.

Because semiconductor devices are highly integrated, patterns formed on a substrate are very small. As a result, the width of the patterns and the space between the patterns must be greatly reduced. As the size of a contact for connecting wirings is reduced, the aspect ratio of the contact increases. Thus, various failures, such as a contact non-open failure, a contact resistance failure, a bridge failure generated between adjacent conductive patterns, and a failure caused by a short channel effect of a transistor, occur in accordance with the reduction of the design rule for manufacturing semiconductor devices. Such failures are difficult to overcome because reducing the possibility of one failure frequently causes another unexpected failure.

FIG. 1A is a cross-sectional view of a prior art device illustrating a self-aligned contact making electrical contact with a source or a drain region of a transistor formed on a semiconductor substrate taken along a direction perpendicular to a gate line (hereinafter, referred to as an X-direction). FIG. 1B is a cross-sectional view of a prior art device illustrating the self-aligned contact making electrical contact with the source or the drain region of the transistor disposed on the semiconductor substrate taken along a direction parallel to the gate line (hereinafter, referred to as a Y-direction).

Referring to FIGS. 1A and 1B, a contact 16 is formed by depositing a conductive material in a contact hole 14 after the contact hole 14 has been formed to expose a portion of the semiconductor substrate 10 between gate structures 12 through a self-aligning process. However, because the interval between the gate structures 12 is narrow, the area of the exposed portion of the semiconductor substrate 10 is very small. The reduction of the area where the contact 16 makes contact with the source or the drain region 11 of the semiconductor substrate 10 increases the contact resistance.

As a result of the difficulties in controlling etching processes, the high aspect ratio of the contact hole 14, and the small size of the contact hole 14, insulation material or polymers may frequently remain in the contact hole 14. The insulation material or the polymers remaining in the contact hole 14 may cause failures such as an increase in the contact resistance or a contact non-open failure. To reduce such failures, any material remaining in the contact hole 14 is removed through a reinforced rinsing process after the formation of the contact hole 14.

When a reinforced rinsing process is conducted, occurrence of failures (e.g., a contact non-open failure and an increase in the contact resistance) may be greatly reduced. However, the insulation film 13 between the contact holes 14 may be etched during the rinsing process.

As shown in FIG. 1B, the interval (W) between the contact holes 14 extending along the Y-direction is very narrow, and, as a result, a nitride spacer is not formed at a lateral portion of the contact hole 14 in the Y-direction. Hence, the adjacent contact holes 14 may be in communication with each other when the insulation film 13 is exceedingly etched during the rinsing process. Thus, when conductive materials are filled in the contact holes 14 to form the contact 16, the conductive materials become electrically connected with each other, thereby causing a bridge failure between the adjacent contact holes 14.

These above-described bridge failures may be generated frequently because of the reduction of the design rule for manufacturing the semiconductor device. In addition, bridge failures may be generated in a certain portion of the semiconductor substrate or a certain chip as well as in the entire semiconductor substrate. Hence, the yield of a semiconductor manufacturing process may be greatly decreased when these failures are encountered.

Japanese Laid Open Patent Publication No. 2000-340655 discloses a method for forming a contact hole while reducing a short failure between contact holes. According to the above-mentioned method, after first, second and third dielectric films are formed on a substrate, a via is formed to partially expose the first dielectric film. A spacer is formed at a lateral (sidewall) portion of the via such that the spacer has an etching rate much slower than that of the first dielectric film. Then, a contact hole is formed after etching the exposed first dielectric film. Thus, the short failure between the contacts may be reduced due to the provision of the spacer. However, because the spacer comprises a material having the etching rate much slower than that of the first dielectric film, the short failure between the contacts may be still result despite the use of the spacer when a void is generated in the lateral portion of the contact hole. Additionally, an anisotropic etching process is typically executed to form the spacer, thus the process for manufacturing the semiconductor device becomes more complicated.

SUMMARY OF THE INVENTION

At least one exemplary embodiment of the present invention provides a method for forming a self-aligned contact in a semiconductor device which can reduce process failures caused in accordance with the reduction of the design rule.

At least one other exemplary embodiment of the present invention provides a method for manufacturing a semiconductor device that includes a self-aligned contact.

At least one exemplary embodiment of the present invention provides a method for forming a self-aligned contact in a semiconductor device. In particular, conductive structures that each include a nitride film as an uppermost layer are formed on a semiconductor substrate. After forming spacers at side portions of the conductive structures, an interlayer dielectric film is formed to cover the conductive structures. A self-aligned contact hole having a sidewall that exposes the spacers of the conductive structures is formed by selectively etching a portion of the interlayer dielectric film to expose a portion of the semiconductor substrate between the conductive structures. A buffer layer for reducing the consumption of the interlayer dielectric film exposed through the sidewall of the self-aligned contact hole is formed by depositing an insulation material on the sidewall of the self-aligned contact hole, on a bottom face of the self-aligned contact hole, and on the interlayer dielectric film. The thickness of the buffer layer at an upper portion of the self-aligned contact hole is greater than that the thickness of the buffer layer at the bottom face of the self-aligned contact hole. The portion of the buffer layer on the bottom face of the self-aligned contact hole is removed so that the buffer layer remains on the sidewall of the self-aligned contact hole. A contact making contact with the semiconductor substrate is then formed by depositing a conductive material in the self-aligned contact hole.

At least one other exemplary embodiment of the present invention provides a method for forming a semiconductor device. After forming gate structures that include gate oxide film patterns, conductive film patterns, and nitride film patterns on a semiconductor substrate, impurities are primarily doped into a portion of the semiconductor substrate between the gate structures using the gate structures as masks. Spacers are then formed at side portions of the gate structures. An interlayer dielectric film is formed to cover the gate structures that contain the spacers. A contact hole that exposes the portion of the semiconductor substrate between the gate structures is formed by selectively etching the interlayer dielectric film. A buffer layer is formed to reduce the consumption of the interlayer dielectric film exposed through the contact hole and to reduce damage to the semiconductor substrate during an ion implantation process by depositing an insulation material on a sidewall of the contact hole, on a bottom face of the contact hole, and on the interlayer dielectric film. The thickness of the buffer layer at an upper portion of the contact hole is greater than the thickness of the buffer layer at the bottom face of the contact hole. Impurities are then secondarily doped into the portion of the semiconductor substrate under the bottom face of the contact hole by implanting the impurities through the buffer layer on the bottom face of the contact hole. Next, the buffer layer on the bottom face of the contact hole is removed so that the buffer layer remains on the sidewall of the contact hole. The contact that makes contact with the doped portion of the semiconductor substrate is formed by depositing a conductive material in the contact hole.

In at least one exemplary embodiment of the present invention provides a method for forming a semiconductor device. After forming gate structures that include gate oxide film patterns, conductive film patterns and nitride film patterns on a semiconductor substrate, impurities are primarily doped into a portion of the semiconductor substrate between the gate structures using the gate structures as masks. Spacers are formed at the side portions of the gate structures and an interlayer dielectric film is formed to cover the gate structures that contain the spacers. After selectively etching the interlayer dielectric film to form a contact hole that exposes the portion of the semiconductor substrate between the gate structures, a middle temperature oxide film is formed on a sidewall of the contact hole, on a bottom face of the contact hole, and on the interlayer dielectric film by a low pressure chemical vapor deposition process. The thickness of the middle temperature oxide film at an upper portion of the contact hole is greater than the thickness of the middle temperature oxide film at the bottom face of the contact hole. Impurities are then secondarily doped into the portion of the semiconductor substrate under the bottom face of the contact hole by implanting the impurities through the middle temperature oxide film on the bottom face of the contact hole. The middle temperature oxide film on the bottom face of the contact hole is removed so that the middle temperature oxide film remains on the sidewall of the contact hole. A contact that makes contact with the doped portion of the semiconductor substrate is then formed by depositing a conductive material in the contact hole.

In at least one exemplary embodiment of the present invention, a buffer layer is formed to reduce the consumption of an interlayer dielectric film exposed through the self-aligned contact hole and to reduce the damage to a substrate during an ion implanting process. Therefore, failures such as a contact bridge failure and damage to the substrate can be reduced.

BRIEF DESCRIPTION OF THE DRAWINGS

Exemplary embodiments of the present invention will become readily apparent by reference to the following detailed description when considered in conjunction with the accompanying drawings wherein.

DETAILED DESCRIPTION OF THE PREFERRED EMBODIMENTS

Figure 1A:
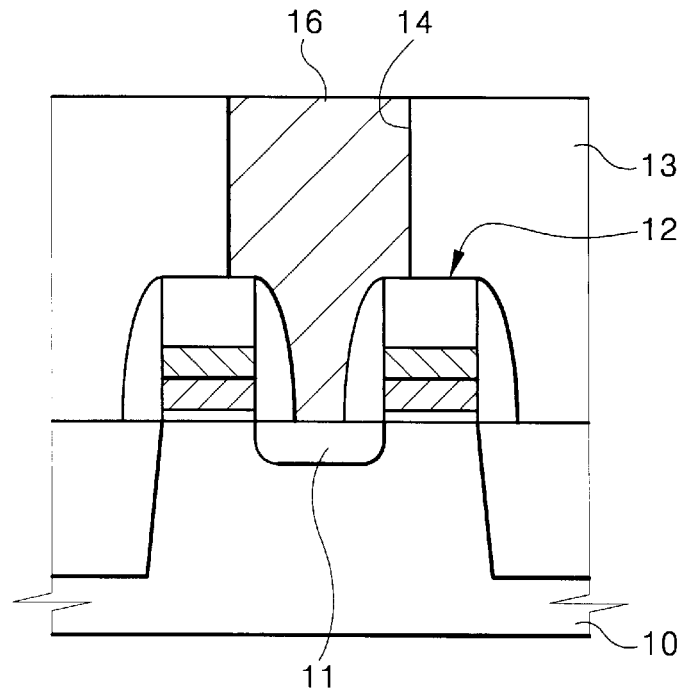
FIGS. 1A and 1B are cross-sectional views respectively illustrating a self-aligned contact of a semiconductor device taken in an X-direction and in a Y-direction according to the conventional method known within the prior art.
Figure 1B:
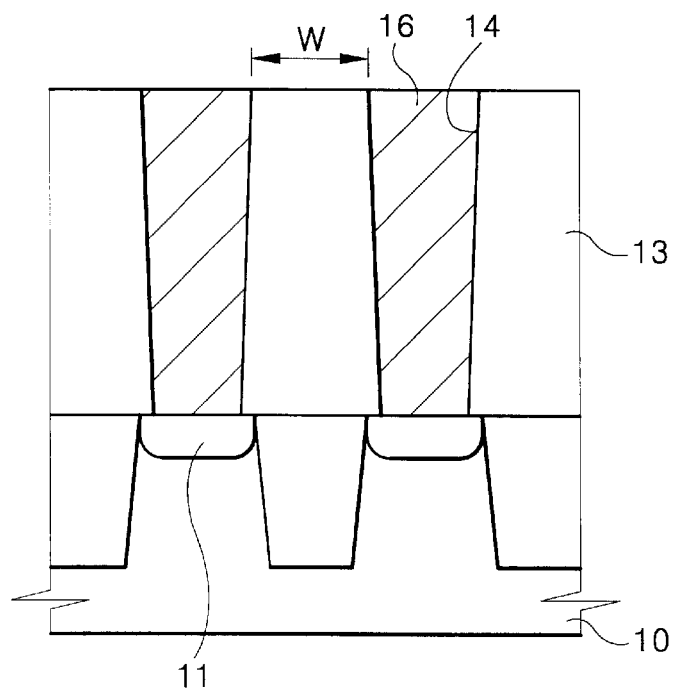

Hereinafter, exemplary embodiments of the present invention will be described in detail with reference to the attached drawings. However, the exemplary embodiments of the present invention can be modified into various other forms, and the scope of the present invention must not be interpreted as being restricted to the exemplary embodiments. The exemplary embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Embodiment 1

FIGS. 2A to 2G are cross-sectional views illustrating a semiconductor device manufactured according to the method for forming a self-aligned contact of a semiconductor device, depicting a first exemplary embodiment of the present invention.

Figure 2A:
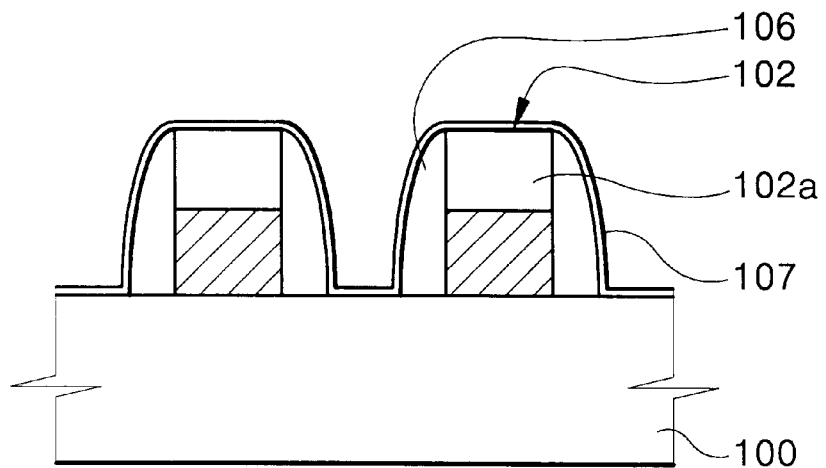
FIGS. 2A to 2G are partial cross-sectional views illustrating a semiconductor device formed according to a method for forming a self-aligned contact of a semiconductor device taken along an X-direction according to a first exemplary embodiment of the present invention.

Referring first to FIG. 2A, conductive structures 102 are formed on a semiconductor substrate 100 in which silicon nitride patterns 102a are positioned at upper portions of the conductive structures 102 as uppermost layers. Nitride spacers 106 are formed at side portions of the conductive structures 102.

An etching stop layer 107 having a uniform thickness is then formed on the semiconductor substrate 100 and on the conductive structures 102 that contain the nitride spacers 106. The etching stop layer 107 may be formed of silicon nitride which has an etching selectivity with respect to silicon oxide.

One skilled in the art will recognize that other films for a semiconductor device can be formed on the semiconductor substrate 100 though no such films are depicted in the drawings. In addition, the conductive structures 102 can include wirings for transferring signals, such as bit lines, and gate electrodes for transistors of the semiconductor device. The conductive structures 102 are regularly disposed on the semiconductor device 100 by minute intervals.

Figure 2B:
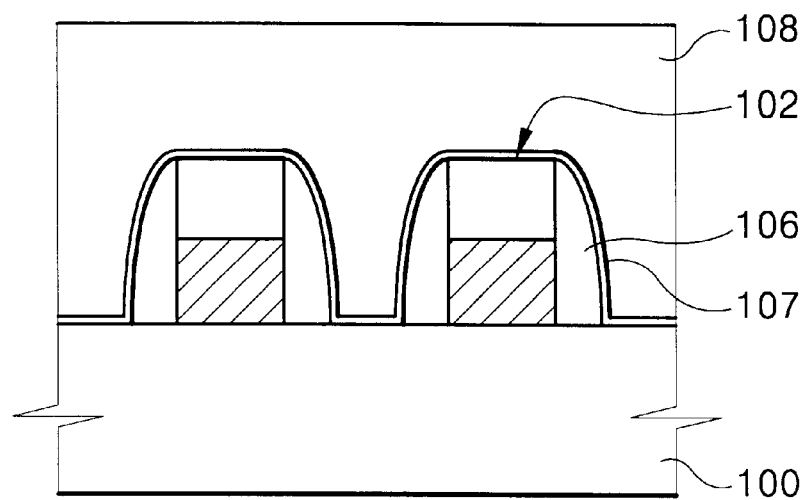

Referring to FIG. 2B, an interlayer dielectric film 108 is formed on the semiconductor substrate 100 to cover the conductive structures 102 and the nitride spacers 106. The interlayer dielectric film 108 is may be formed of a material having a high etching selectivity with respect to the silicon nitride patterns 102a and the nitride spacers 106 because portions of the interlayer dielectric film 108 are etched by a self-aligning method which utilizes the etching selectivity of the interlayer dielectric film 108 with respect to the silicon nitride patterns 102a and the nitride spacers 106.

However, because the conductive structures 102 that contain the nitride spacers 106 are very closely disposed by the minute intervals, it is difficult to form the interlayer dielectric film 108 in the narrow space between the conductive structures 102 without creating voids in the interlayer dielectric film 108. Thus, the material for the interlayer dielectric film 108 may be confined to a material that has a good reflowability to fill a gap and a process for coating such a material can be used to form the interlayer dielectric film 108 in particular, the interlayer dielectric film 108 may be formed using an oxide such as boro-phosphor silicate glass (BPSG) or silicon on glass (SOG), to completely fill the space between the conductive structures 102. In addition, the oxide that has a good reflowability may be porous so that the oxide can be easily etched with an etching solution for a wet etching or a rinsing solution. Further, the interlayer dielectric film 108 may be formed using an oxide having a good step coverage property through a high density plasma (HDP) process.

Figure 2C:
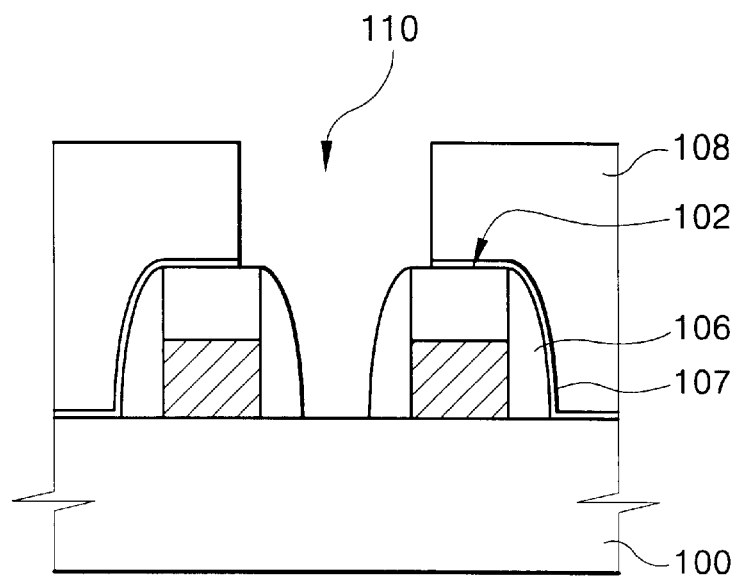

Referring now to FIG. 2C, a self-aligned contact hole 110 exposing the semiconductor substrate 100 is formed between the conductive structures 102 that contain the nitride spacers 106. In particular, after a mask pattern (not shown) that includes an open region covering a portion of the semiconductor substrate 100 between the conductive structures 102 is placed over the interlayer dielectric film 108, the interlayer dielectric film 108 is etched using the mask pattern to expose a portion of the etching stop layer 107. The self-aligned contact hole 110 that exposes the portion of the semiconductor substrate 100 is formed after etching the exposed portion of the etching stop layer 107. The etching stop layer 107 and the nitride spacers 106 are very slowly etched compared to the interlayer dielectric film formed of an oxide which is rapidly etched. Thus, the self-aligned contact hole 110 has an upper portion that is wider than a lower portion thereof as shown in FIG. 2C. In the semiconductor device manufactured under the reduced design rule, the critical dimension of the lower portion of the self-aligned contact hole 110 has a narrow value of approximately 500 to 3,000 Å.

Figure 2D:
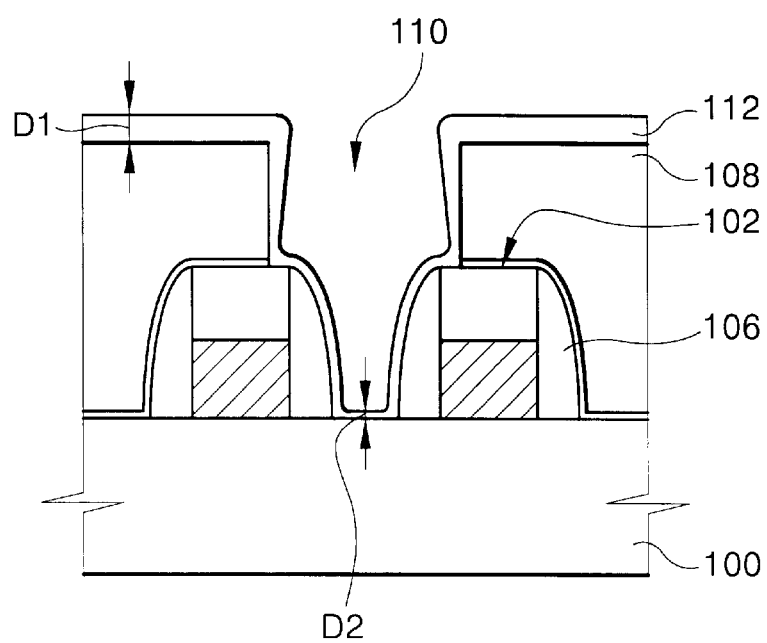

As depicted in FIG. 2D, an insulation material is deposited on the bottom face and the sidewalls of the self-aligned contact hole 110 and on the interlayer dielectric film 108, thereby forming a buffer layer 112 to reduce the consumption of the interlayer dielectric film 108 exposed through the sidewall of the self-aligned contact hole 110. At the time of formation of the buffer layer, a thickness (D1) of the buffer layer 112 formed on the interlayer dielectric film 108 and on the upper portion of the self-aligned contact hole 110 is greater than the thickness (D2) of the buffer layer 112 formed on the bottom surface of the self-aligned contact hole 110.

Figure 3A:
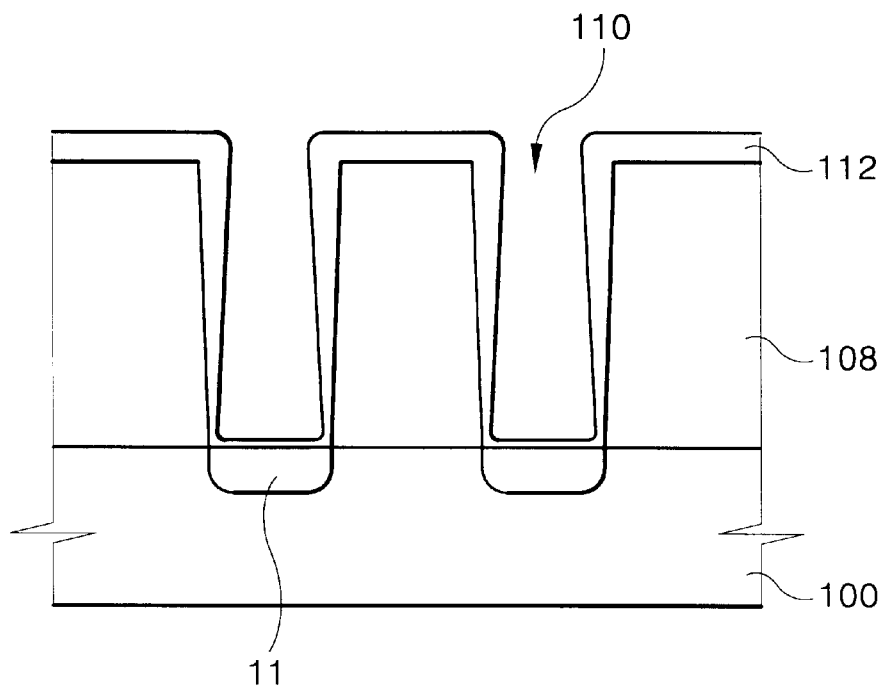
FIGS. 3A and 3B are partial cross-sectional views illustrating a semiconductor device manufactured according to the method for forming the self-aligned contact of the semiconductor device taken in a Y-direction according to the first exemplary embodiment of the present invention.

FIG. 3A is a partial cross-sectional view illustrating a semiconductor device including a self-aligned contact hole in a Y-direction after forming the buffer layer.

As shown in FIGS. 2D and 3A, a portion of the buffer layer 112 on the bottom face of the self-aligned contact hole 110 will be removed in a successive process. Therefore, the buffer layer 112 preferably has a thin thickness on the bottom face of the self-aligned contact hole. In particular, the portion of the buffer layer 112 on the bottom face of the self-aligned contact hole 110 has a thickness of approximately 30 to 300 Å.

In addition, to decrease a reduction of the critical dimension of the bottom face of the self-aligned contact hole 110, the buffer layer 112 has a thin thickness at a lower portion of the sidewall of the self-aligned contact hole 110 so that the interval between the sidewalls of the self-aligned contact hole 110 is sufficiently maintained. In particular, the thickness of the buffer layer 112 at the lower portion of the sidewall of the self-aligned contact hole 110 decreases as the exposed portion of the semiconductor device 100 through the self-aligned contact hole 110 is reduced. On the other hand, the buffer layer 112 cannot sufficiently reduce the consumption of the interlayer dielectric film 108 exposed through the sidewall of the self-aligned contact hole 110 if the buffer layer 112 becomes too thin. Therefore, in order to form the buffer layer 112 in a manner to maintain the critical dimension of the bottom face of the self-aligned contact hole 110 and reduce the consumption of the interlayer dielectric film, a step coverage of the buffer layer 112, represented as a ratio between the thickness (D1) of the buffer layer 112 on the interlayer dielectric film 108 and the thickness (D2) of the buffer layer 112 on the bottom face of the self-aligned contact hole 110, is desirably about 20 to 60%. When the buffer layer 112 has a step coverage of about 20 to 60%, the thickness of the buffer layer 112 decreases from the upper portion of the self-aligned contact hole 110 to the lower portion of the self-aligned contact hole 110 as is shown in FIG. 3A.

A buffer layer 112 having the above-described structure can sufficiently reduce the consumption of the interlayer dielectric film 108 because the buffer layer 112 has a greater thickness at the upper portion of the self-aligned contact hole 110. In addition, the buffer layer 112 has a relatively lesser thickness at the lower portion of the self-aligned contact hole 110, which decreases the reduction of the bottom face of the self-aligned contact hole 110.

The buffer layer 112 has a good adhesiveness in order to continuously form on the sidewall and on the bottom face of the self-aligned contact hole 110. When the buffer layer 112 is discontinuously formed, the buffer layer 112 may not adequately cover the void in the interlayer dielectric film 108 or may not reduce the consumption of the interlayer dielectric film 108.

Additionally, the buffer layer 112 may be formed using an insulation material that has a relatively small dielectric constant in particular, the buffer layer 112 can be formed using silicon nitride or silicon oxide, and more specifically, the buffer layer 112 can be formed using a silicon oxide having a dielectric constant about half of dielectric constant of the silicon nitride in order to decrease the capacitance of a parasite capacitor between the conductive structures 102 and conductive materials that are to be filled in the self-aligned contact hole 110.

The buffer layer 112 includes a middle temperature oxide (MTO) film formed by a low pressure chemical vapor deposition (LPCVD) process. The MTO film can be formed by introducing the semiconductor substrate 100 into a deposition furnace having a temperature of about 700 to 800° C. and a pressure of about 0.5 to 1 Torr. The MTO film is very slowly deposited on a stepped region where patterns are closely formed in comparison with an even region when the MTO film is deposited by an identical process. Experimentation has shown that a step coverage of the MTO film, represented as a ratio between the thickness of the MTO film on an upper face of an insulation layer in which a contact hole is formed and another thickness of the MTO film on the bottom face of the contact hole, is about 50 to 60% when the MTO film is formed in the contact hole having an aspect ratio of about 10:1.

Figure 2E:
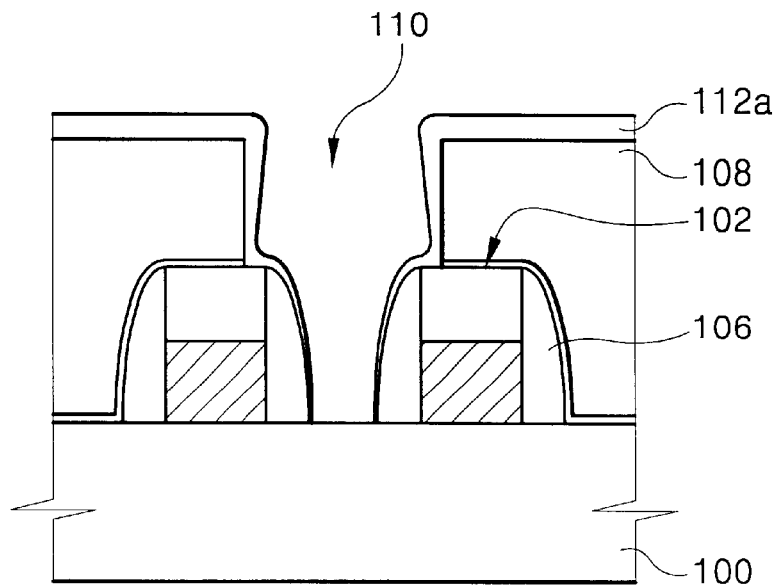

Referring now to FIG. 2E, a portion of the semiconductor substrate 100 is exposed by etching the buffer layer 112a on the bottom face of the self-aligned contact hole 110. In this case, the buffer layer 112a, which has a predetermined thickness, remains on the sidewalls of the self-aligned contact hole 110 during the etching process. The buffer layer 112a can be etched through a dry etching process or a wet etching process. Because the semiconductor substrate 100 exposed through the bottom face of the self-aligned contact hole 110 can be cured with an etching solution used in the wet etching process, the buffer layer 112a may be etched by the wet etching process. Further, since the buffer layer 112a has a relatively large thickness at the upper portion of the self-aligned contact hole 110, the buffer layer 112a remains on the sidewalls of the self-aligned contact hole 110 when the bottom face portion of the buffer layer 112a is etched by the wet etching process.

Figure 3B:
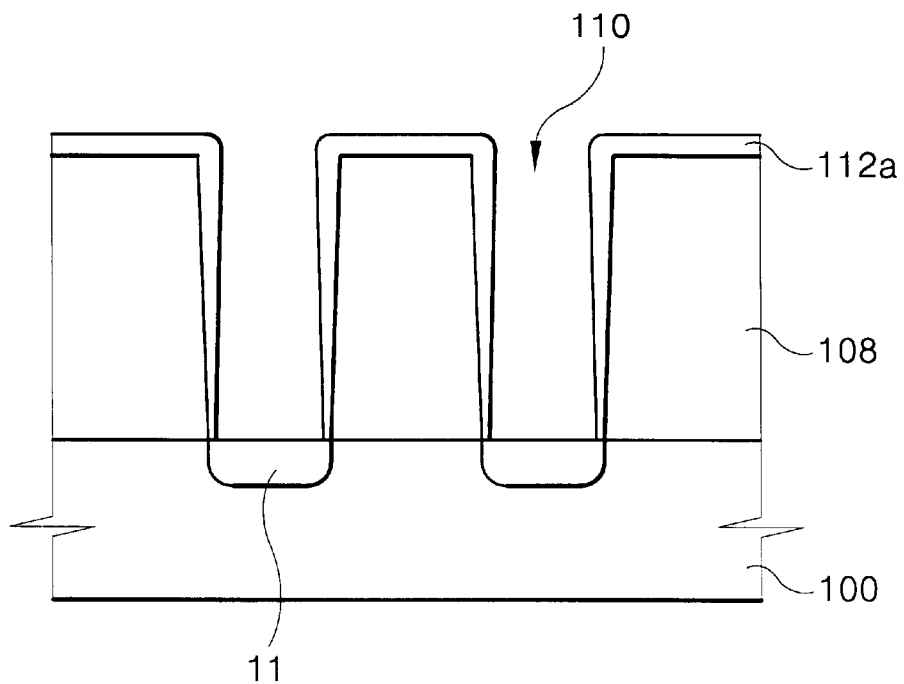

FIG. 3B is a partial cross-sectional view illustrating the semiconductor device including the self-aligned contact hole along the Y-direction after etching the buffer layer on the bottom face of the self-aligned contact hole.

Referring to FIG. 3B, bridge failures between adjacent contact holes 110 can be reduced because the interlayer dielectric film 108 is not consumed due to the existence of the buffer layer 112a.

Figure 2F:
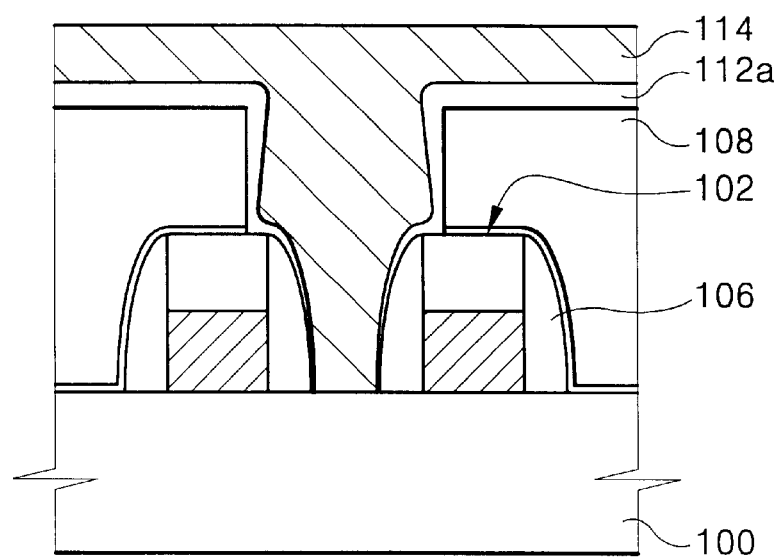

Referring to FIG. 2F, after a pre-cleaning process is performed to remove native oxide films formed in the self-aligned contact hole 110, a conductive film 114 that makes electrical contact with the semiconductor substrate 100 is successively formed in the self-aligned contact hole 110 by filling a conductive material in the self-aligned contact hole 110. The conductive material may include polysilicon doped with impurities or metal that includes tungsten (W) or aluminum (Al).

The pre-cleaning process is executed with respect to the semiconductor substrate 100 including the self-aligned contact hole 110 with a solution that includes hydrogen fluoride (HF). Because oxides are removed during the pre-cleaning process, the above-mentioned etching process for to remove the buffer layer 112a on the bottom face of the self-aligned contact hole 110 can be omitted when the buffer layer 112a on the bottom face of the self-aligned contact hole 110 that has the thin dimension thereof is sufficiently removed by the pre-cleaning process.

Figure 2G:
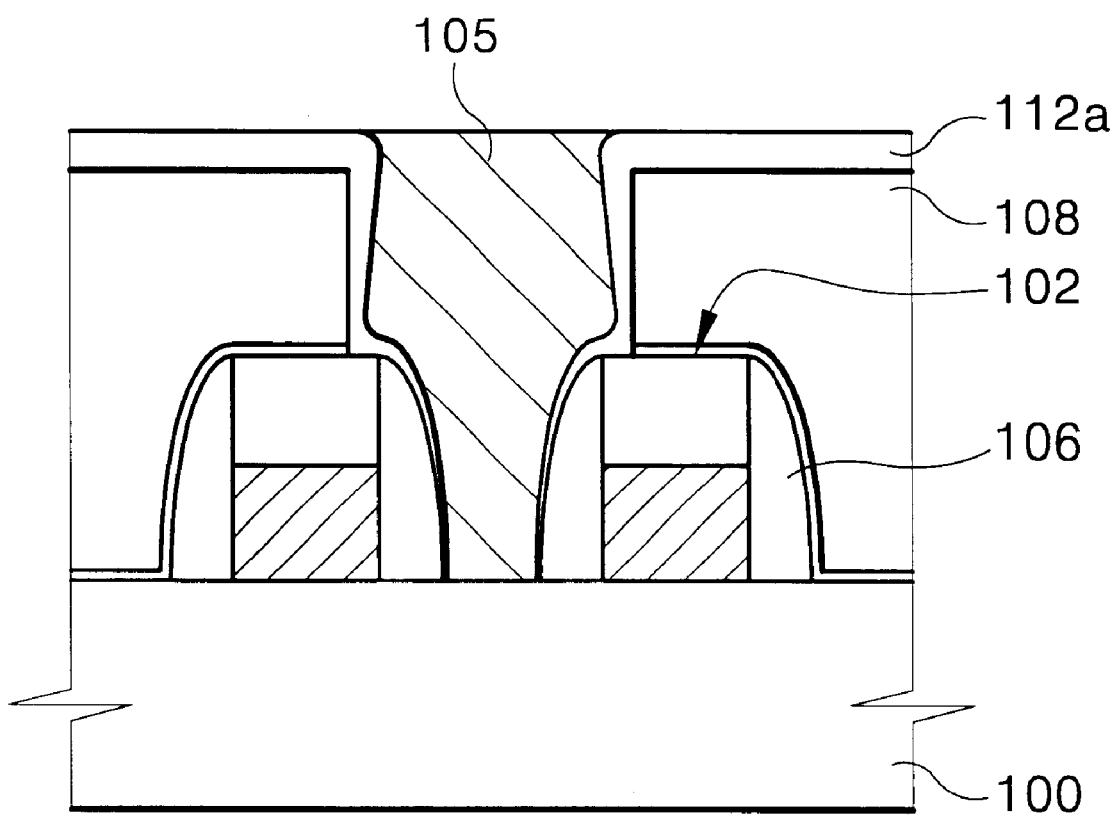

Referring to FIG. 2G, an upper face of the conductive film 114 is planarized so that the conductive film 114 remains in the self-aligned contact hole 110, thereby forming a contact 105 that makes electrical contact with the semiconductor substrate 100.

During the formation of the contact 105, the interlayer dielectric film 108 is barely consumed in the successive etching and rinsing processes because the buffer layer 112a is formed on the sidewalls of the self-aligned contact hole 110. Thus, a bridge failure between adjacent contact holes 110 due to the consumption of the interlayer dielectric film 108 can be reduced. When polysilicon is filled in the self-aligned contact hole 110 as the conductive material, impurity ions included in the interlayer dielectric film 108 may be moved into the conductive material. In particular, when the interlayer dielectric film 108 is formed of BPSG, the impurity ions in the interlayer dielectric film 108 are boron (B) or phosphorus (P). On the other hand, when the interlayer dielectric film 108 is formed of an HDP oxide, the impurity ion(s) included in the interlayer dielectric film 108 are carbon (C). Because the buffer layer 112a blocks the migration of the impurity ions, the reliability of the semiconductor device can be.

Embodiment 2

Figure 4:
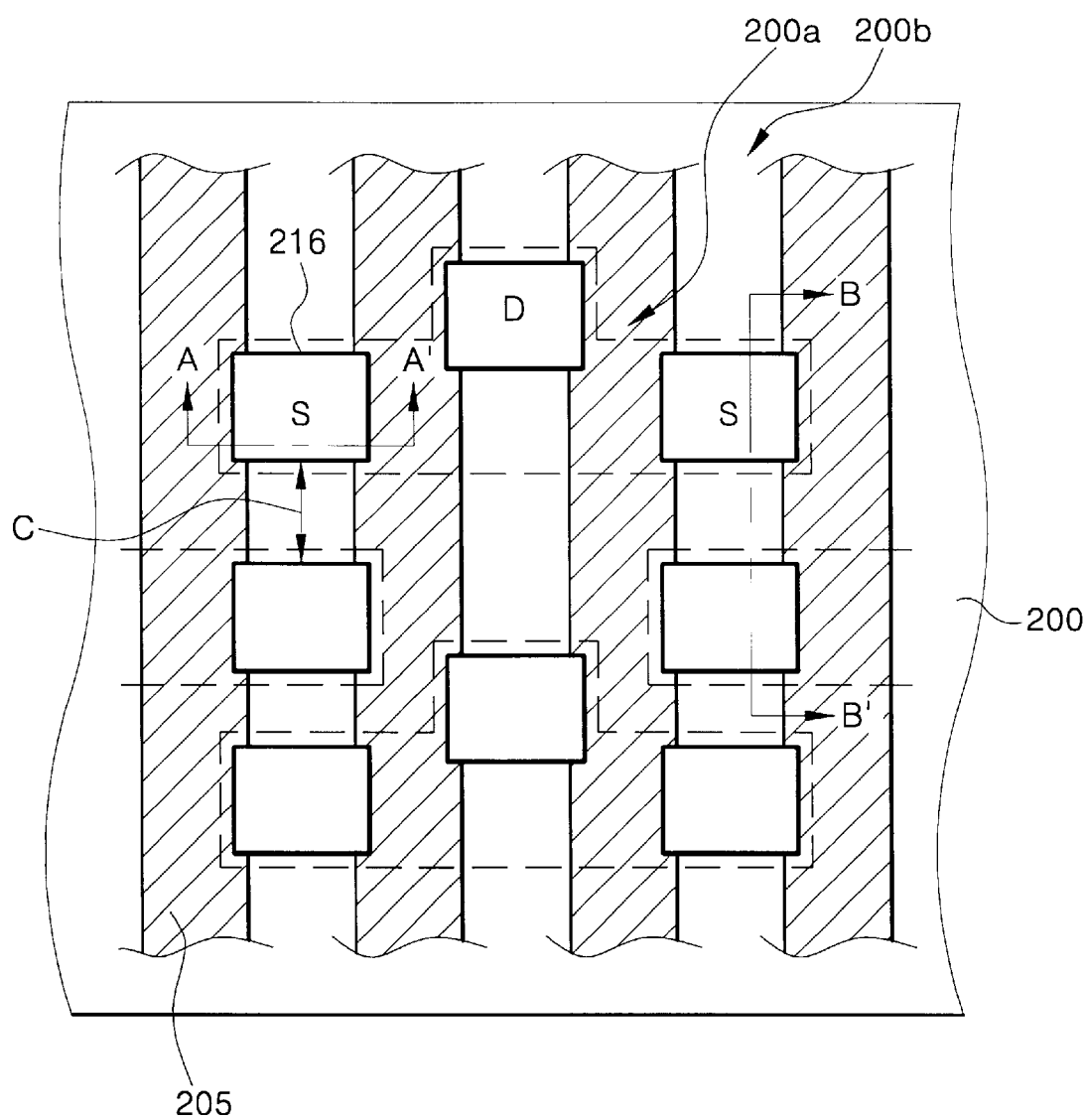
FIG. 4 is a plan view showing a semiconductor device including transistors according to a second exemplary embodiment of the present invention.

FIG. 4 is a plan view showing a semiconductor device that includes transistors according to the second exemplary embodiment of the present invention. FIGS. 5A to 5I are cross-sectional views illustrating a semiconductor formed by the method for manufacturing the semiconductor device that includes the transistors taken along a line of A–A' in FIG. 4. FIGS. 6A to 6C are cross-sectional views illustrating the semiconductor device including the transistors taken along a line of B–B' in FIG. 4.

Figure 5A:
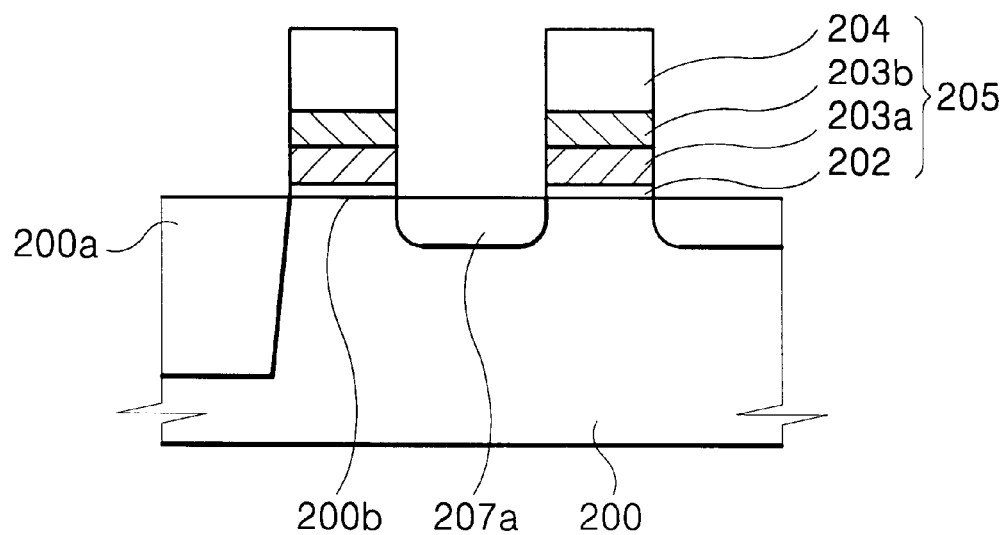
FIGS. 5A to 5I are partial cross-sectional views illustrating a semiconductor device manufactured according to the method for manufacturing semiconductor devices including the transistors taken in an X-direction depicting to the second exemplary embodiment of the present invention.
Figure 6A:
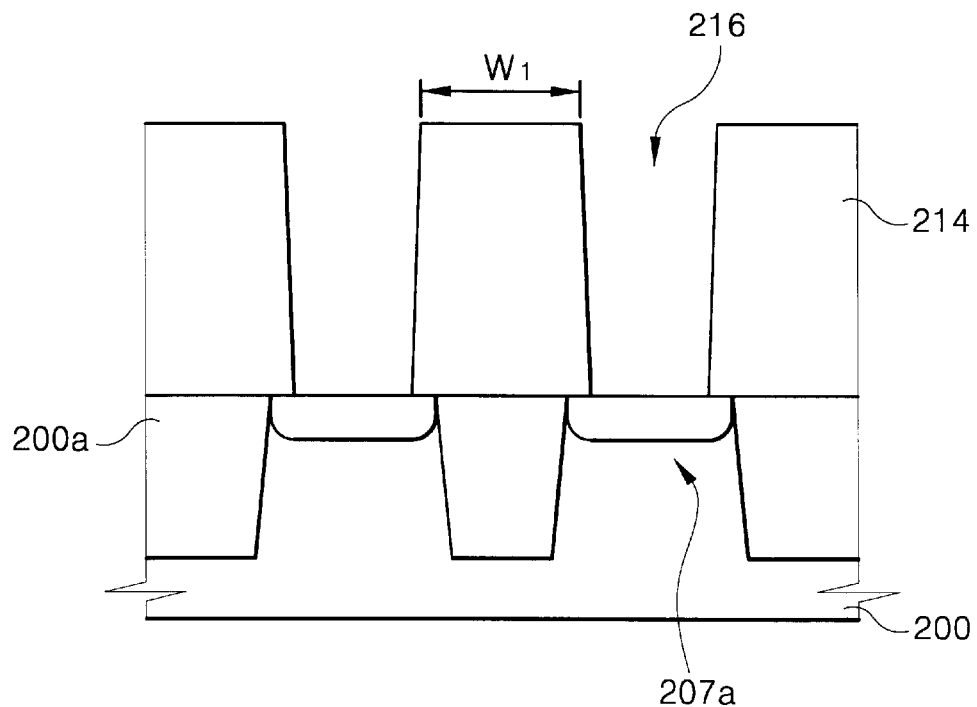
FIGS. 6A to 6C are partial cross-sectional views illustrating a semiconductor device formed according to the method including the transistors taken along a Y-direction according to the second exemplary embodiment of the present invention.
Figure 6B:
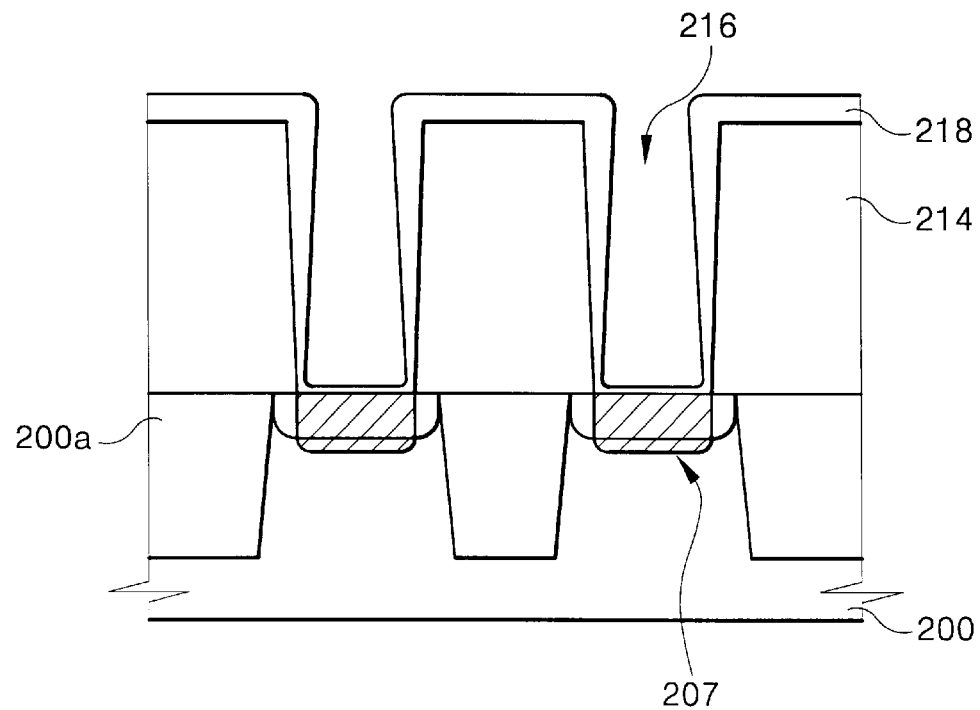
Figure 6C:
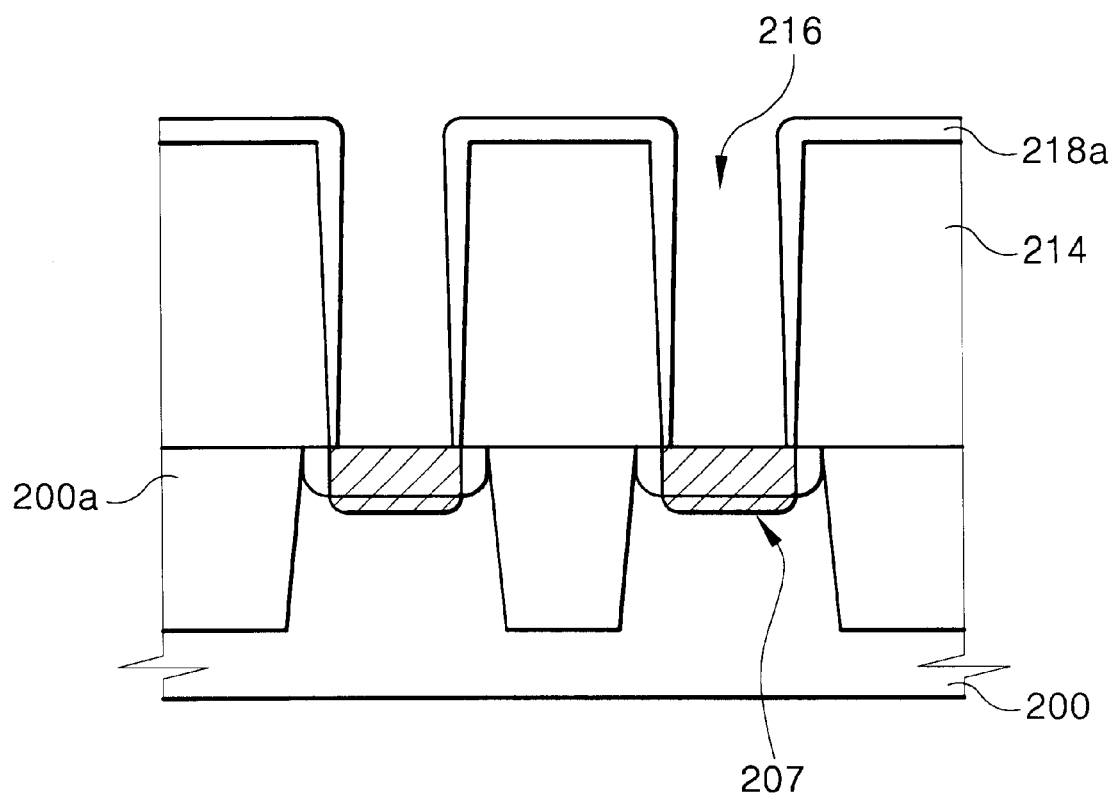

Referring first to FIGS. 4 and 5A, a field oxide film is formed on a semiconductor substrate 200 by an isolation process such as an improved local oxidation of silicon (LOCOS) process or a trench isolation process so that the semiconductor substrate 200 is divided into an active region 200a and a field region 200b.

Gate structures 205, including gate oxide patterns 202, conductive film patterns 203a and 203b, and nitride film patterns 204, are then formed on the semiconductor substrate 200. The gate structures 205 have line shapes that are closely disposed by regularly intervals (as seen in FIGS. 3A and 3B).

A process for forming the gate structures 205 will be described below. After a gate oxide film (not shown) that has a relatively small thickness of approximately 30 to 100 Å is formed on the substrate 200, a conductive film for gate electrodes is formed on the gate oxide film. The conductive film includes a polysilicon film and a tungsten silicide film or a tungsten film. The polysilicon film is formed using polysilicon doped with impurities by a high density through a doping process such as a diffusion process, an ion implantation process, or an in-situ doping process so that the polysilicon film has a thickness of approximately 1,000 Å. The tungsten film or the tungsten silicide film is then formed on the polysilicon film to have a thickness of approximately 1,500 Å.

Subsequently, a silicon nitride film having a thickness of approximately 1,800 to 2,000 Å is formed on the conductive film. The film formed on the conductive film is not limited to the silicon nitride film. The film can be formed with a material that has an etching selectivity similar to silicon oxide under specific etching conditions.

Next, predetermined portions of the silicon nitride film, the conductive film, and the gate oxide film are etched to form gate structures 205 that include gate oxide film patterns 202, conductive film patterns 203a and 203b, and silicon nitride film patterns 204.

Impurity ions that have a low concentration are then preliminarily implanted into the substrate 200 using the gate structures as masks so that source and drain regions 207a of a transistor are formed between the gate structures 205. Source regions (S) and drain regions (D) are disposed as shown in FIG. 4.

Figure 5B:
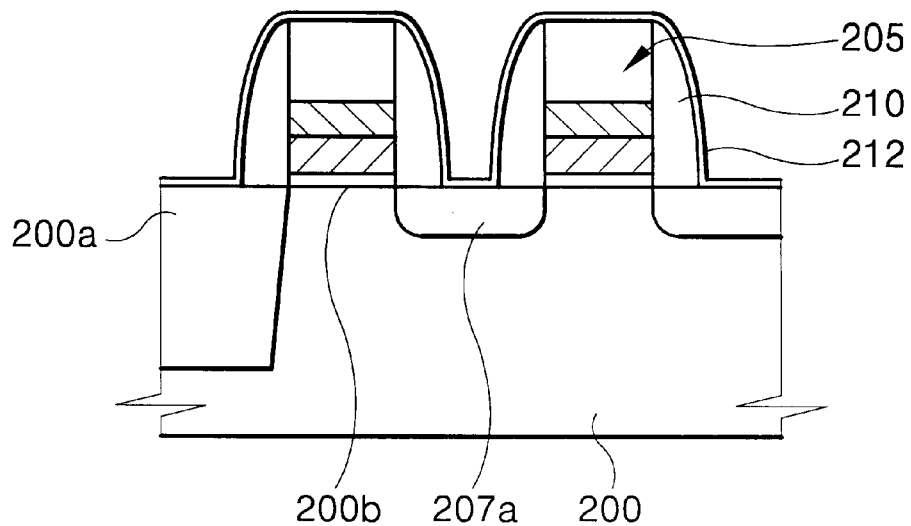

Referring to FIG. 5B, a silicon nitride film having a uniform thickness is formed on the gate structures 205 and on the substrate 200. The silicon nitride film has a thickness of approximately 1,300 Å. The silicon nitride film is then anisotropically etched so that the silicon nitride film remains at the side portions of the gate structures 205 only, thereby forming nitride spacers 210 at the lateral portions of the gate structure 205.

Subsequently, an etching stop layer 212 is coated on the entire surface of the gate structures 205, including the nitride spacers 210. The etching stop layer 212 has a relatively small thickness of approximately 50 to 300 Å. The etching stop layer 212 includes a material having an etching selectivity similar to silicon oxide under specific etching conditions, such as, for example silicon nitride.

Figure 5C:
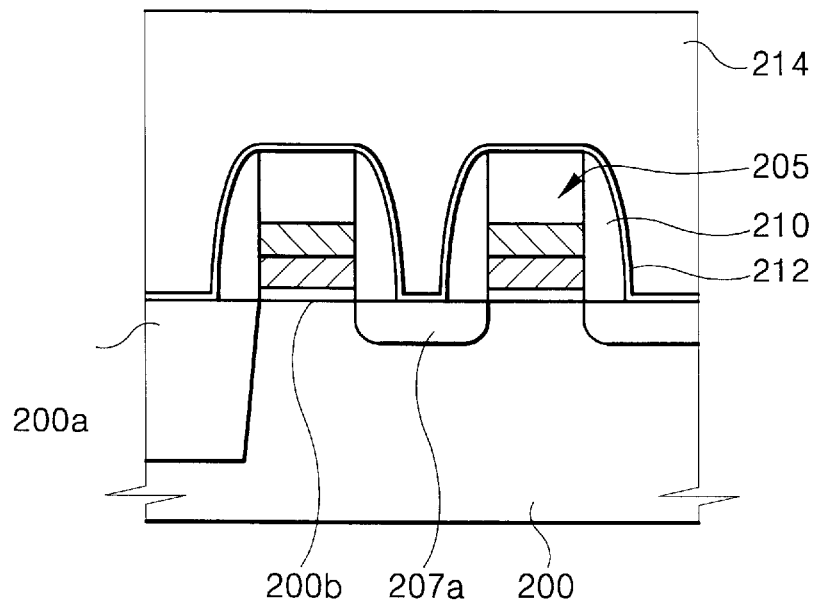

Referring to FIG. 5C, an interlayer dielectric film 214 is formed to cover the gate structures 205 and the nitride spacers 210. The interlayer dielectric film 214 is includes a material such as silicon oxide that has a high etching selectivity relative to silicon nitride. Because the gate structures 205, including the nitride spacers 210, are closely disposed by minute intervals and the gate structures 205 have relatively high heights, the interlayer dielectric film 214 may not be able to be formed between the gate structures 205 without containing voids. Thus, the interlayer dielectric film 214 may be formed of a material having good reflowability to fill the gap between the gate structures 205 through an appropriate process. In particular, the interlayer dielectric film 214 can be formed using a reflowable oxide, such as BPSG, SOG, or an HDP oxide, that has good step coverage to fill the gap between the gate structures 205 without voids. An upper face of the interlayer dielectric film 214 can be planarized or another insulation film can be formed on the planarized upper face of the interlayer dielectric film 214 after the interlayer dielectric film 214 is polished to expose the uppermost nitride film pattern 204 of the gate structure 205.

Figure 5D:
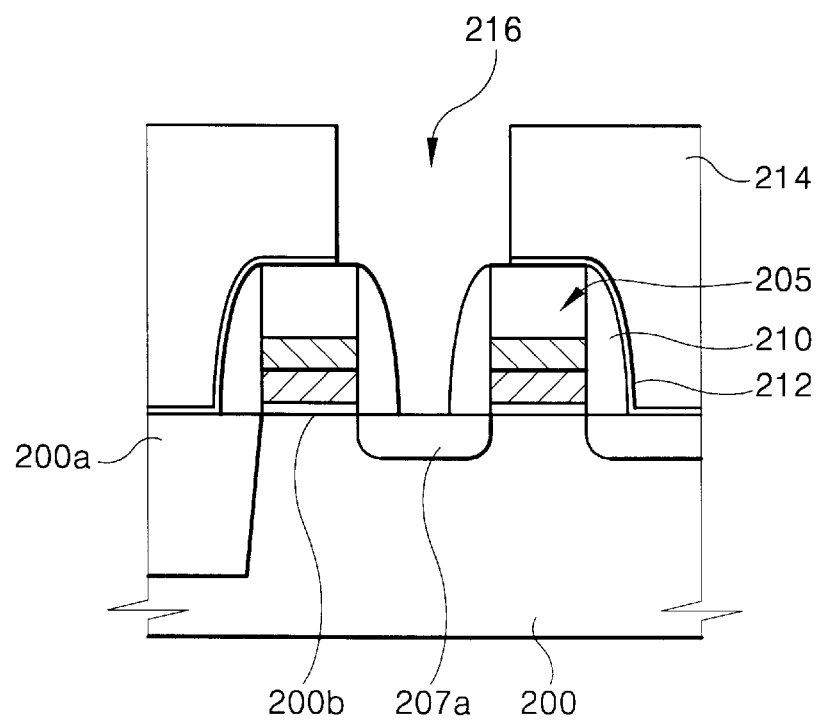

Referring to FIG. 5D, a self-aligned contact hole 216 is formed between the gate structures 205 to expose a portion of the substrate 200. More specifically, after a mask pattern that includes an open region covering the portion of the substrate 200 between the gate structures 205 is formed on the interlayer dielectric film 214, the interlayer dielectric film 214 is etched, and then the etching stop layer 212 is etched, thereby forming the self-aligned contact hole 216 that exposes the portion of the substrate 200 between the gate structures 205. The etching stop layer 212, the nitride film pattern 204, and the nitride spacer 210 are relatively slowly etched since they are formed of nitride whereas the interlayer dielectric film 214, which is formed of oxide, is rapidly etched. Therefore, an upper portion of the self-aligned contact hole 216 is wider than a lower portion thereof as shown in FIG. 5D. In a semiconductor device manufactured in accordance with the reduced design rule, the bottom portion of the self-aligned contact hole 216 is narrowly formed to have a critical dimension of approximately 500 to 3,000 Å.

FIG. 6A is a cross-sectional view showing the self-aligned contact hole taken in a Y-direction. As shown in FIG. 6A, an interval (W1) between the self-aligned contact holes 216 adjacent to each other in the Y-direction is very narrow, and the nitride spacer 210 is not positioned on a sidewall of the contact hole 216 along the Y-direction.

Figure 5E:
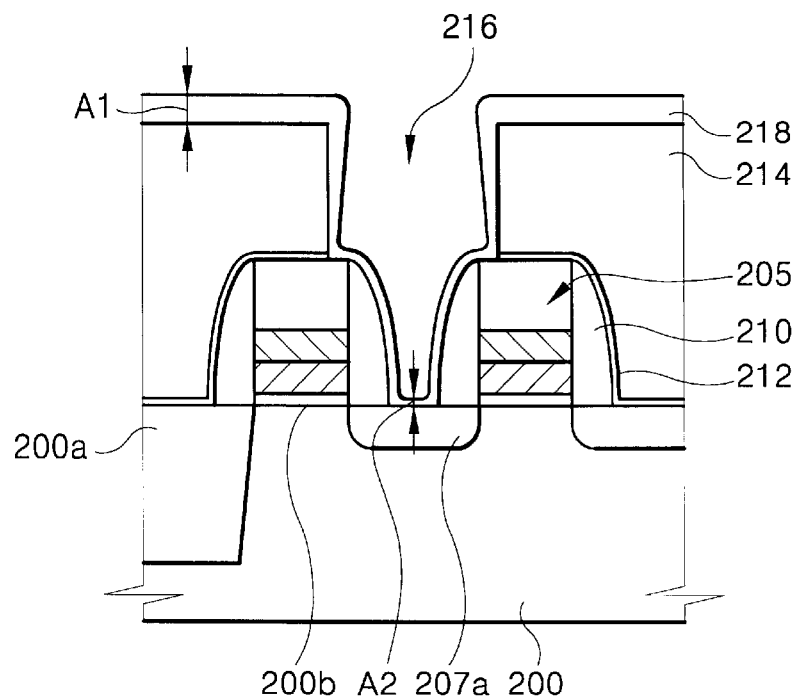

Referring to FIG. 5E, an insulation material is deposited on the sidewalls and on the bottom face of the self-aligned contact hole 216 to form a buffer layer 218 to reduce the consumption of the interlayer dielectric film 214 exposed through the sidewalls of the self-aligned contact holes 216. The buffer layer 218 includes a portion on the upper portion of the self-aligned contact hole 216 that has a thickness (A1) greater than the thickness (A2) of a portion of the buffer layer 218 on the bottom face of the self-aligned contact hole 216.

The buffer layer 218 is formed to reduce the consumption of the interlayer dielectric film 214 as well as to reduce the reduction of the critical dimension of the bottom face of the self-aligned contact hole 216. To decrease the reduction of the critical dimension of the bottom face of the self-aligned contact hole 216, the buffer layer 218 has a relatively small thickness at a lower portion of the sidewalls of the self-aligned contact hole 216, which sufficiently maintains an interval between sidewalls of the self-aligned contact hole 216. In addition, the buffer layer 218 has a relatively small thickness on the bottom face of the self-aligned contact hole 216 to implant impurity ions onto the substrate 200 through the buffer layer 218. Preferably, the thickness of the buffer layer 218 formed on the bottom face of the self-aligned contact hole 216 is approximately 30 to 300 Å. When the entire thickness of the buffer layer 218 is too thin, however, the buffer layer 218 cannot reduce the consumption of the interlayer dielectric film 214 exposed through the sidewalls of the self-aligned contact hole 216. Therefore, the thickness of the buffer layer 218 is desirably decreases from the upper portion of the sidewall of the contact hole 216 to the bottom face of the contact hole 216. In particular, the buffer layer 218 is formed to have a step coverage, indicated as the ratio between one thickness (A1) of the buffer layer 218 on the interlayer dielectric film 214 and another thickness (A2) of the buffer layer 218 on the bottom face of the self-aligned contact hole 216, of about 20 to 60%. As a result, the buffer layer 218 can cover the voids in the interlayer dielectric film 214 and decrease the reduction of the dimension of the bottom face of the self-aligned contact hole 216.

The buffer layer 218 has a good adhesiveness to permit a continuous formation from the sidewalls of the contact hole 216 to the bottom face of the contact hole 216. When the buffer layer 218 is discontinuously formed in the contact hole 216, the buffer layer 218 cannot adequately cover the voids in the interlayer dielectric film 214 or reduce the consumption of the interlayer dielectric film 214. Additionally, the buffer layer 218 is formed of an insulation material that has a relatively small dielectric constant. As a result, the capacitance of the parasitic capacitor generated between the gate structure 205 and the conductive material filled in the contact hole 216 is decreased. To achieve the above-mentioned properties, the buffer layer 218 can include MTO formed through a low pressure chemical vapor deposition (LPCVD) process. The MTO can be formed by introducing the substrate 200 into a deposition furnace having a temperature of approximately 700 to 800° C. and a pressure of approximately 0.5 to 1 Torr under an oxygen atmosphere. Further, the thickness of the buffer layer 218 can be controlled in accordance with the time of the LPCVD process.

Figure 5F:
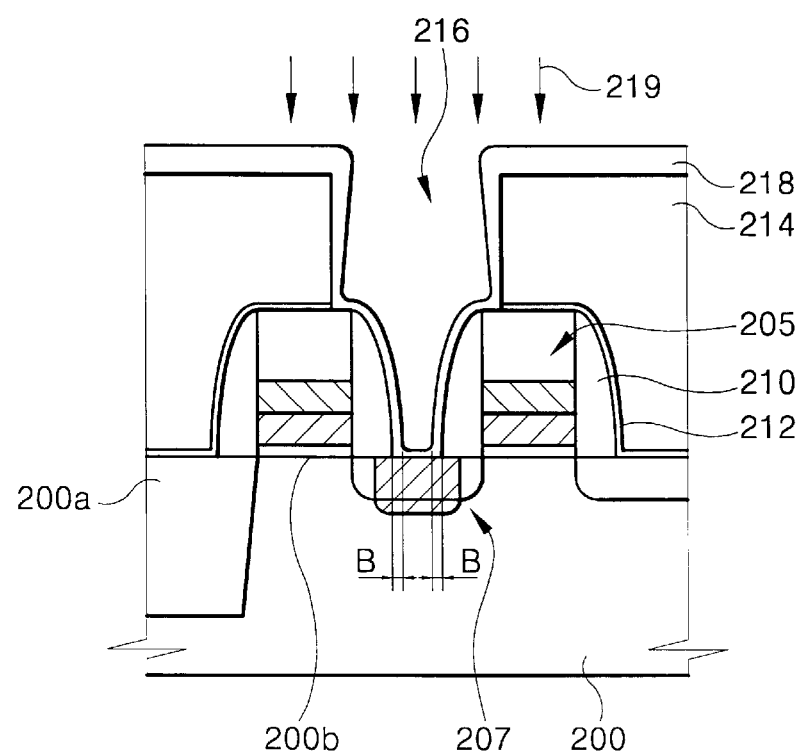

Referring now to FIG. 5F, impurities 219 are secondarily implanted into the substrate 200 through the bottom face of the contact hole 216 on which the buffer layer 218 is formed, and on the gate structure 205 and the spacers 210, using the gate structures as masks such that a source/drain region 207 has a lightly doped drain (LDD) structure formed on the substrate 200.

FIG. 6B is cross-sectional view illustrating the self-aligned contact hole taken in the Y-direction in which the buffer layer and the LDD structured source/drain region are formed. As shown in FIG. 6B, in the process for secondarily implanting the impurities onto the substrate 200, the impurities are vertically injected onto the substrate 200. However, since the substrate 200 is generally grown to have a crystal orientation of [100], the impurities can be widely injected and deeply diffused into the substrate 200 when the impurities are vertically injected onto the substrate 200, as compared to processes in which the impurities are injected into the substrate 200 at a desired angle (e.g., a tilted implantation), even though the tilted implantations of the impurities are performed an energy identical to the vertical implantations. As a result of the tilted injection, the impurities are abnormally and deeply diffused into the substrate 200 so that a failure, such as a leakage current, flowing toward a substrate 200 formed of silicon, may frequently occur. Additionally, the impurities are abnormally and widely diffused into the substrate 200 so that the length of the gate channel is reduced to cause other failure such as a punch through. Furthermore, the reliability of the semiconductor device may be deteriorated because the substrate 200 may be damaged during the secondarily ion implanting process.

In the present invention, however, the buffer layer 218, which has a relatively small thickness, is formed on the bottom face of the contact hole 216 during the second ion implantation process. Therefore, the impurity ions are not widely and deeply diffused into the substrate 200 due to the existence of the buffer layer 218, compared to conventional ion implanting process. As a result, failures such as a leakage current due to the channeling of the impurity ions can be reduced. In addition, the quantity of the impurity ions injected onto the substrate 200 is reduced accordance with the thickness (2B) of the buffer layer 218 at both lateral portions of the bottom face of the contact hole 216. Thus, the length of an electrical channel between the source and the drain increases, which reduces failures such as a punch through caused by a short channel effect. Furthermore, the damage to the substrate 200 can be reduced because the exposed portion of the substrate 200 decreases during the ion implanting process.

Figure 5G:
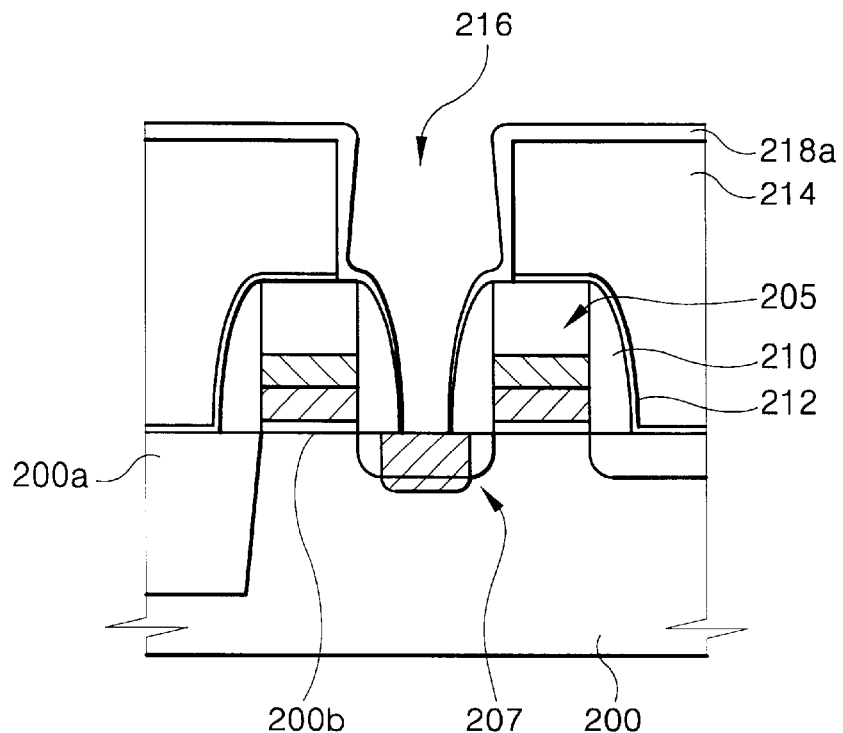

Referring to FIG. 5G, a portion of the buffer layer 218a on the bottom face of the contact hole 216 is etched to expose the substrate 200 while a portion of the buffer layer 218a remains on the sidewalls of the contact hole 216 at a predetermined thickness. The buffer layer 218a can be etched in accordance with a wet etching process or a dry etching process. The buffer layer 218a may be etched through the wet etching process because the substrate 200 exposed through the contact hole 216 can be rinsed and cured with an etching solution used in the wet etching process. Because the portion of the buffer layer 218a at the upper portion of the contact hole 216 has a greater thickness than that of other portions of the buffer layer 218a, the buffer layer 218a can partially remain on the sidewalls of the contact hole 216 when the buffer layer 218a on the bottom face of the contact hole 216 is etched in accordance with the wet etching process.

FIG. 6C is a cross-sectional view illustrating the self-aligned contact hole taken along the Y-direction after the buffer layer on the bottom face of the self-aligned contact hole is etched. As shown in FIG. 6C, a bridge failure between the contact holes 216 adjacent to each other can be reduced because the interlayer dielectric film 214 is not consumed due to the presence of the buffer layer 218a.

Figure 5H:
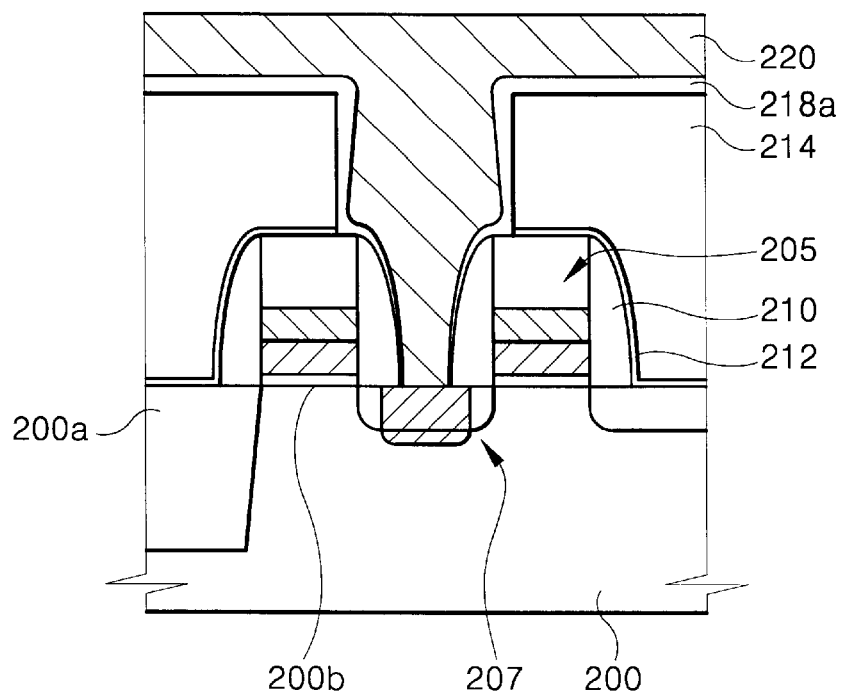

Referring to FIG. 5H, a pre-cleaning process is executed to remove native oxides formed in the contact hole 216, and then a conductive film 220 is successively formed in the contact hole 216 to be electrically connected with the substrate 200. The conductive film 220 may include doped polysilicon or a metal that includes tungsten or aluminum. The pre-cleaning process is performed against the substrate 200 having the contact hole 216 with an etching solution that includes hydrogen fluoride. The above-described etching process for the buffer layer 218a can be omitted when the buffer layer 218a is sufficiently removed during the pre-cleaning process since the pre-cleaning process can remove oxides.

Figure 5I:
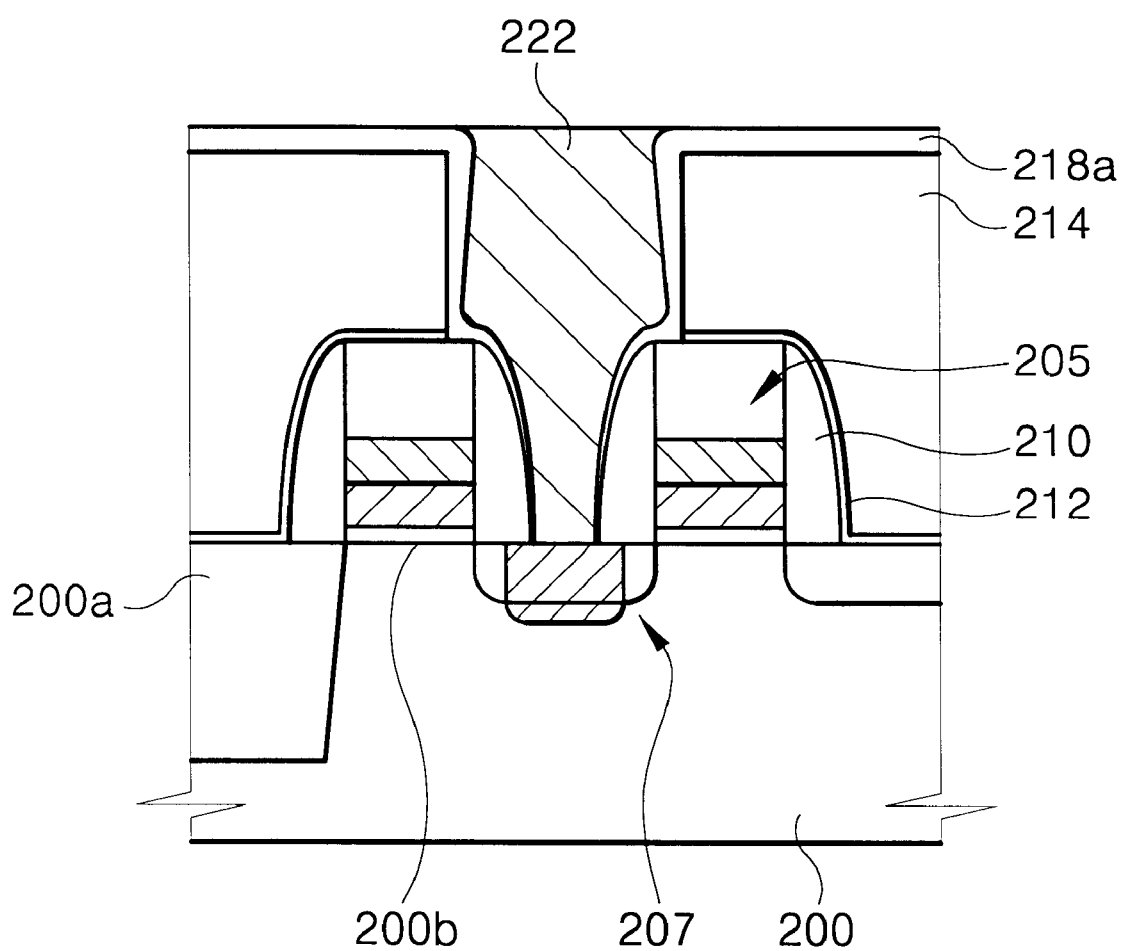

Referring to FIG. 5I, an upper face of the conductive film 220 is planarized such that the conductive film 220 remains in the contact hole 216 only, thereby forming a contact 222 that makes electrical contact with the substrate 200.

Because the buffer layer 218a remains on the sidewall of the contact hole 216, bridge failures between the contact holes 216 can be reduced. The bridge failure may frequently occur at a portion (C) where the contact holes are closely disposed, as is shown in FIG. 4. Additionally, the impurity ions in the interlayer dielectric film 214 may migrate to the conductive film 220 when the conductive film 220 includes polysilicon to fill in the contact hole 216. In the present invention, however, the buffer layer 218a can block the migration of the impurity ions, thereby improving the reliability of the semiconductor device.

As it is described above, the buffer layer is formed to reduce the consumption of the interlayer dielectric film exposed through the self-aligned contact hole and to reduce the damage to a substrate during an ion implanting process. Therefore, failures, such as a contact bridge failure, damage to the substrate, and a failure caused by a short channel effect, can be reduced.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method for forming a self-aligned contact of a semiconductor device comprising:

forming conductive structures on a semiconductor substrate;

forming spacers on sidewalls of the conductive structures;

covering the conductive structures with an interlayer dielectric film;

selectively etching a portion of the interlayer dielectric film to expose a portion of the semiconductor substrate between the conductive structures to form a self-aligned contact hole having a sidewall exposing the spacers of the conductive structures;

adding a buffer layer for reducing a consumption of the interlayer dielectric film exposed through the sidewall of the self-aligned contact hole by depositing an insulation material on the sidewall of the self-aligned contact hole, on a bottom face of the self-aligned contact hole, and on the interlayer dielectric film, wherein a thickness of the buffer layer at an upper portion of the self-aligned contact hole is greater than that the thickness of the buffer layer at the bottom face of the self-aligned contact hole;

partially removing the buffer layer on the bottom face of the self-aligned contact hole such that the buffer layer remains on the sidewall of the self-aligned contact hole; and depositing a conductive material in the self-aligned contact hole to form a self-aligned contact making contact with the semiconductor substrate.

2. The method for forming a self-aligned contact of a semiconductor device of claim 1, wherein the buffer layer formed during said adding step has a step coverage of about 20 to 60%.

3. The method for forming a self-aligned contact of a semiconductor device of claim 1, wherein the thickness of the buffer layer on the bottom face of the self-aligned contact hole after the adding step is approximately 20 to 300 Å.

4. The method for forming a self-aligned contact of a semiconductor device of claim 1, wherein the buffer layer formed during the adding step includes a middle temperature oxide formed by a low pressure chemical vapor deposition process.

5. The method for forming a self-aligned contact of a semiconductor device of claim 4, wherein the middle temperature oxide is formed at a temperature of approximately 700 to 800° C. and under a pressure of approximately 0.5 to 1 Torr.

6. The method for forming a self-aligned contact of a semiconductor device of claim 1, wherein the step of partially removing the buffer layer on the bottom face of the self-aligned contact hole is accomplished by a wet etching process or a dry etching process.

7. The method for forming a self-aligned contact of a semiconductor device of claim 1, further comprising:

cleaning a native oxide formed on the bottom face of the self-aligned contact hole before the step of depositing the conductive material in the self-aligned contact hole.

8. The method for forming a self-aligned contact of a semiconductor device of claim 7, wherein the cleaning step is accomplished using a solution that includes hydrogen fluoride.

9. The method for forming a self-aligned contact of a semiconductor device of claim 1, further comprising:

placing a uniform etching stop layer on the conductive structures and on the semiconductor substrate after the step of forming the spacers.

10. The method for forming a self-aligned contact of a semiconductor device of claim 1, wherein the interlayer dielectric film includes a layer selected from the group consisting of a BPSG layer, an SOG layer and an HDP oxide layer.

11. The method for forming a self-aligned contact of a semiconductor device of claim 1, wherein the conductive material in said depositing step includes a member selected from the group consisting of polysilicon, tungsten and aluminum.

12. The method for forming a self-aligned contact of a semiconductor device of claim 1, further comprising:

planarizing the conductive material such that the conductive material remains in the self-aligned contact hole after depositing the conductive material in the self-aligned contact hole.

13. The method for forming a self-aligned contact of a semiconductor device of claim 1, wherein the conductive structures in said forming step include gate electrodes or conductive lines for transferring signals.

14. A method for forming a semiconductor device comprising:

forming gate structures including gate oxide film patterns, conductive film patterns and nitride film patterns on a semiconductor substrate;

primarily doping impurities into a portion of the semiconductor substrate between the gate structures using the gate structures as masks;

forming spacers at sidewall portions of the gate structures;

covering the gate structures having the spacers with an interlayer dielectric film;

selectively etching the interlayer dielectric film to form a contact hole exposing the portion of the semiconductor substrate between the gate structures;

adding a buffer layer for reducing a consumption of the interlayer dielectric film exposed through the contact hole and for reducing damage of the semiconductor substrate during an ion implantation process by depositing an insulation material on a sidewall of the contact hole, on a bottom face of the contact hole, and on the interlayer dielectric film, wherein a thickness of the buffer layer at an upper portion of the contact hole is greater than the thickness of the buffer layer at the bottom face of the contact hole;

secondarily doping impurities into the portion of the semiconductor substrate under the bottom face of the contact hole by implanting the impurities through the buffer layer on the bottom face of the contact hole;

removing the buffer layer on the bottom face of the contact hole, wherein the buffer layer remains on the sidewall of the contact hole; and depositing a conductive material in the contact hole to form a self-aligned contact that makes contact with the doped portion of the semiconductor substrate.

15. The method for forming a semiconductor device of claim 14, wherein the buffer layer of said adding step has a step coverage of about 20 to 60%.

16. The method for forming a semiconductor device of claim 14, wherein a thickness of the buffer layer on the bottom face of the contact hole formed during said adding step is approximately 20 to 300 Å.

17. The method for forming a semiconductor device of claim 14, wherein the buffer layer in said adding step includes a middle temperature oxide formed by a low pressure chemical vapor deposition process.

18. The method for forming a semiconductor device of claim 17, wherein the middle temperature oxide is formed at a temperature of approximately 700 to 800° C. and a pressure of approximately 0.5 to 1 Torr.

19. The method for forming a semiconductor device of claim 14, further comprising:
cleaning a native oxide formed on the bottom face of the contact hole before the step of depositing the conductive material in the self-aligned contact hole.

20. The method for forming a semiconductor device of claim 14, wherein the impurities are vertically implanted onto the semiconductor substrate during the secondarily doping impurities step.

21. The method for forming a semiconductor device of claim 14, further comprising:
uniformly forming an etching stop layer on the gate structures and on the semiconductor substrate after the step of forming the spacers.

22. The method of claim 14, wherein the semiconductor device includes
a semiconductor substrate;
gate structures including gate oxide film patterns, conductive film patterns, and nitride film patterns on the semiconductor substrate, the semiconductor substrate having impurities doped therein between the gate structures, the gate structures having sidewall portions;
spacers formed on the sidewall portions of the gate structures;
an interlayer dielectric film covering the gate structures and the spacers thereon;
a contact hole exposing a portion of the semiconductor substrate between the gate structures selectively etched into the interlayer dielectric film;
impurities doped into a portion of the semiconductor substrate under a bottom face of the contact hole by implanting the impurities through a buffer layer temporarily added to the bottom face of the contact hole, said buffer layer being retained on a sidewall of the contact hole; and
a conductive material deposited in the contact hole to form a contact making contact with the doped portion of the semiconductor substrate.

23. The method of claim 14, wherein the semiconductor device includes
a semiconductor substrate;
conductive structures formed on the semiconductor substrate, the conductive structures having sidewalls on which spacers are formed;
an interlayer dielectric film covering the conductive structures including the spacers;
a self-aligned contact hole having a sidewall exposing the spacers of the conductive structures by selectively etching a portion of the interlayer dielectric film to expose a portion of the semiconductor substrate between the conductive structures, the self-aligned contact hole having a bottom face and an upper portion;
an insulation material forming a buffer layer added to the sidewall of the self-aligned contact hole, and temporarily added on the bottom face and the upper portion of the self-aligned contact hole with a thickness of the insulation material being greater on the upper portion than on the bottom face for reducing a consumption of the interlayer dielectric film exposed through the sidewall of the self-aligned contact hole; and
a conductive material deposited in the self-aligned contact hole to form a contact making contact with the semiconductor substrate.

24. A method for forming a semiconductor device comprising:
providing gate structures including gate oxide film patterns, conductive film patterns, and nitride film patterns on a semiconductor substrate;
primarily doping impurities into a portion of the semiconductor substrate between the gate structures using the gate structures as masks;
forming spacers on side portions of the gate structures;
covering the gate structures having the spacers with an interlayer dielectric film;
selectively etching the interlayer dielectric film to form a contact hole exposing the portion of the semiconductor substrate between the gate structures;
placing a middle temperature oxide film on a sidewall of the contact hole, on a bottom face of the contact hole, and on the interlayer dielectric film by a low pressure chemical vapor deposition process, wherein a thickness of the middle temperature oxide film at an upper portion of the contact hole is greater than the thickness of the middle temperature oxide film at the bottom face of the contact hole;
secondarily doping impurities into the portion of the semiconductor substrate under the bottom face of the contact hole by implanting the impurities through the middle temperature oxide film on the bottom face of the contact hole;
removing the portion of the middle temperature oxide film on the bottom face of the contact hole wherein the middle temperature oxide film remains on the sidewall of the contact hole; and
depositing a conductive material in the contact hole to form a contact making contact with the doped portion of the semiconductor substrate.

25. The method for forming a semiconductor device of claim 24, wherein the middle temperature oxide of said placing step is formed at a temperature of approximately 700 to 800° C. and under a pressure of approximately 0.5 to 1 Torr.

26. A semiconductor device comprising:
a semiconductor substrate; gate structures including gate oxide film patterns, conductive film patterns, and nitride film patterns on the semiconductor substrate, the semiconductor substrate having impurities doped therein between the gate structures, the gate structures having sidewall portions;
spacers formed on the sidewall portions of the gate structures;
an interlayer dielectric film covering the gate structures and the spacers thereon;
a contact hole exposing the portion of the semiconductor substrate between the gate structures selectively etched into the interlayer dielectric film;
impurities doped into the portion of the semiconductor substrate under the bottom face of the contact hole by implanting the impurities through a buffer layer temporarily added to the bottom face of the contact hole, said buffer layer being retained on the sidewall of the contact hole; and
a conductive material deposited in the contact hole to form a contact making contact with the doped portion of the semiconductor substrate.

27. A semiconductor device comprising:
a semiconductor substrate;

conductive structures formed on the semiconductor substrate, the conductive structures having sidewalls on which spacers are formed;

an interlayer dielectric film covering the conductive structures including the spacers;

a self-aligned contact hole having a sidewall exposing the spacers of the conductive structures by selectively etching a portion of the interlayer dielectric film to expose a portion of the semiconductor substrate between the conductive structures, the self-aligned contact hole having a bottom face and an upper portion;

an insulation material forming a buffer layer added to the sidewall of the self-aligned contact hole, and temporarily added on the bottom face and the upper portion of the self-aligned contact hole with a thickness of the insulation material being greater on the upper portion than on the bottom face for reducing a consumption of the interlayer dielectric film exposed through the sidewall of the self-aligned contact hole; and a conductive material deposited in the self-aligned contact hole to form a contact making contact with the semiconductor substrate.

28. A method of forming a self-aligned contact of a semiconductor device comprising:

forming conductive structures on a substrate;

covering the conductive structures with a film;

selectively etching the film to expose a portion of the substrate between the conductive structures to form a self-aligned contact hole having sidewalls and a bottom face;

adding a buffer layer to the sidewalls of the self-aligned contact hole;

depositing a conductive material in the self aligned contact hole to form a self aligned contact.

29. The method of claim 28, wherein an upper portion of the self-aligned contact is wider than the bottom face.

30. The method of claim 29, wherein adding a buffer layer to the sidewalls of the self-aligned contact hole comprises:

depositing an insulation material on the sidewalls of the self-aligned contact hole, the bottom face of the self-aligned contact hole, and on the film; and removing the buffer layer from the bottom face of the self-aligned contact hole.

31. The method of claim 30, wherein a thickness of the buffer layer at the upper portion of the self-aligned contact hole is greater that a thickness of the buffer layer at the bottom face.

32. The method of claim 30, wherein the step of removing the buffer layer from the bottom face of the self-aligned contact hole is accomplished by a wet etching process or a dry etching process.

33. The method of claim 28, wherein the semiconductor device includes a semiconductor substrate;

gate structures including gate oxide film patterns, conductive film patterns, and nitride film patterns on the semiconductor substrate, the semiconductor substrate having impurities doped therein between the gate structures, the gate structures having sidewall portions;

spacers formed on the sidewall portions of the gate structures;

an interlayer dielectric film covering the gate structures and the spacers thereon;

a contact hole exposing a portion of the semiconductor substrate between the gate structures selectively etched into the interlayer dielectric film;

impurities doped into a portion of the semiconductor substrate under a bottom face of the contact hole by implanting the impurities through a buffer layer temporarily added to the bottom face of the contact hole, said buffer layer being retained on a sidewall of the contact hole; and a conductive material deposited in the contact hole to form a contact making contact with the doped portion of the semiconductor substrate.

34. The method of claim 28, wherein the semiconductor device includes a semiconductor substrate;

conductive structures formed on the semiconductor substrate, the conductive structures having sidewalls on which spacers are formed;

an interlayer dielectric film covering the conductive structures including the spacers;

a self-aligned contact hole having a sidewall exposing the spacers of the conductive structures by selectively etching a portion of the interlayer dielectric film to expose a portion of the semiconductor substrate between the conductive structures, the self-aligned contact hole having a bottom face and an upper portion;

an insulation material forming a buffer layer added to the sidewall of the self-aligned contact hole, and temporarily added on the bottom face and the upper portion of the self-aligned contact hole with a thickness of the insulation material being greater on the upper portion than on the bottom face for reducing a consumption of the interlayer dielectric film exposed through the sidewall of the self-aligned contact hole; and a conductive material deposited in the self-aligned contact hole to form a contact making contact with the semiconductor substrate.

* * * * *